United States Patent [19]

Kezer et al.

[11] Patent Number: 5,121,035

[45] Date of Patent: Jun. 9, 1992

[54] HIGH SPEED GALLIUM ARSENIDE LATCH USING DEPLETION MODE LOGIC

[75] Inventors: Robert C. Kezer, Thousand Oaks; Kenneth R. Elliott, Newbury Park, both of Calif.

[73] Assignee: Rockwell International Corporation, Seal Beach, Calif.

[21] Appl. No.: 661,760

[22] Filed: Feb. 27, 1991

[51] Int. Cl.$^5$ .................. H03K 3/26; H03K 19/017
[52] U.S. Cl. ................... 315/279; 307/571; 307/584
[58] Field of Search .................. 307/279, 571, 584

[56] References Cited

U.S. PATENT DOCUMENTS

| | | | |
|---|---|---|---|
| 4,521,703 | 6/1985 | Dingwall | 307/279 X |
| 4,707,808 | 11/1987 | Heimbigner | 307/584 X |
| 4,764,897 | 8/1988 | Kameyama et al. | 307/279 X |
| 4,883,985 | 11/1989 | Katsu et al. | 307/279 |
| 4,939,390 | 7/1990 | Coe | 307/279 X |
| 4,975,596 | 12/1990 | Thomas et al. | 307/279 X |
| 5,032,741 | 7/1991 | Smith | 307/279 |

Primary Examiner—Eugene R. LaRoche
Assistant Examiner—Do Hyun Yoo
Attorney, Agent, or Firm—John J. Deinken

[57] ABSTRACT

A non-inverting gallium arsenide depletion mode latch circuit is responsive to high and low input data, and to clock pulses from a clock having high and low pulses for loading data and for translating data from the input to the output in a single gate delay. The circuit includes a pair of pull-up FETs having their conduction paths connected in parallel with an output node in circuit with the FETs for output data. A positive feedback path is enabled from one of the FETs for reinforcing the data at the output node. The one FET enables the feedback path during clock pulses in the low direction, while the other FET applies data to the node during high clock pulses. Data input FETs enable and disable the other FET in accordance with the input data and selective clock pulses, while a clock pulse input FET enables and disables the one FET in accordance with the clock pulses.

14 Claims, 1 Drawing Sheet

5,121,035

HIGH SPEED GALLIUM ARSENIDE LATCH USING DEPLETION MODE LOGIC

BACKGROUND OF THE INVENTION

This invention relates to the field of high speed latches. Conventional prior art latches are slow, require a two phase complementary clock, consume a large amount of power, and suffer from signal inversion. The present invention overcomes each of these objectionable characteristics.

SUMMARY OF THE INVENTION

The latch of this invention uses three basic functional paths in the form of a data input path, a data output path, and a positive feedback path. The data input path is controlled by high and low data signals which influence a FET in the data output path. On low clock signals, when it is necessary to maintain the data, the clock pulse also influences the data input circuit to shift over to the positive feedback circuit and thereby reinforce the data output potential. By using gallium arsenide depletion MESFETs, the input is translated to the output in a single gate delay without inversion.

DESCRIPTION OF THE INVENTION

Figure 1:
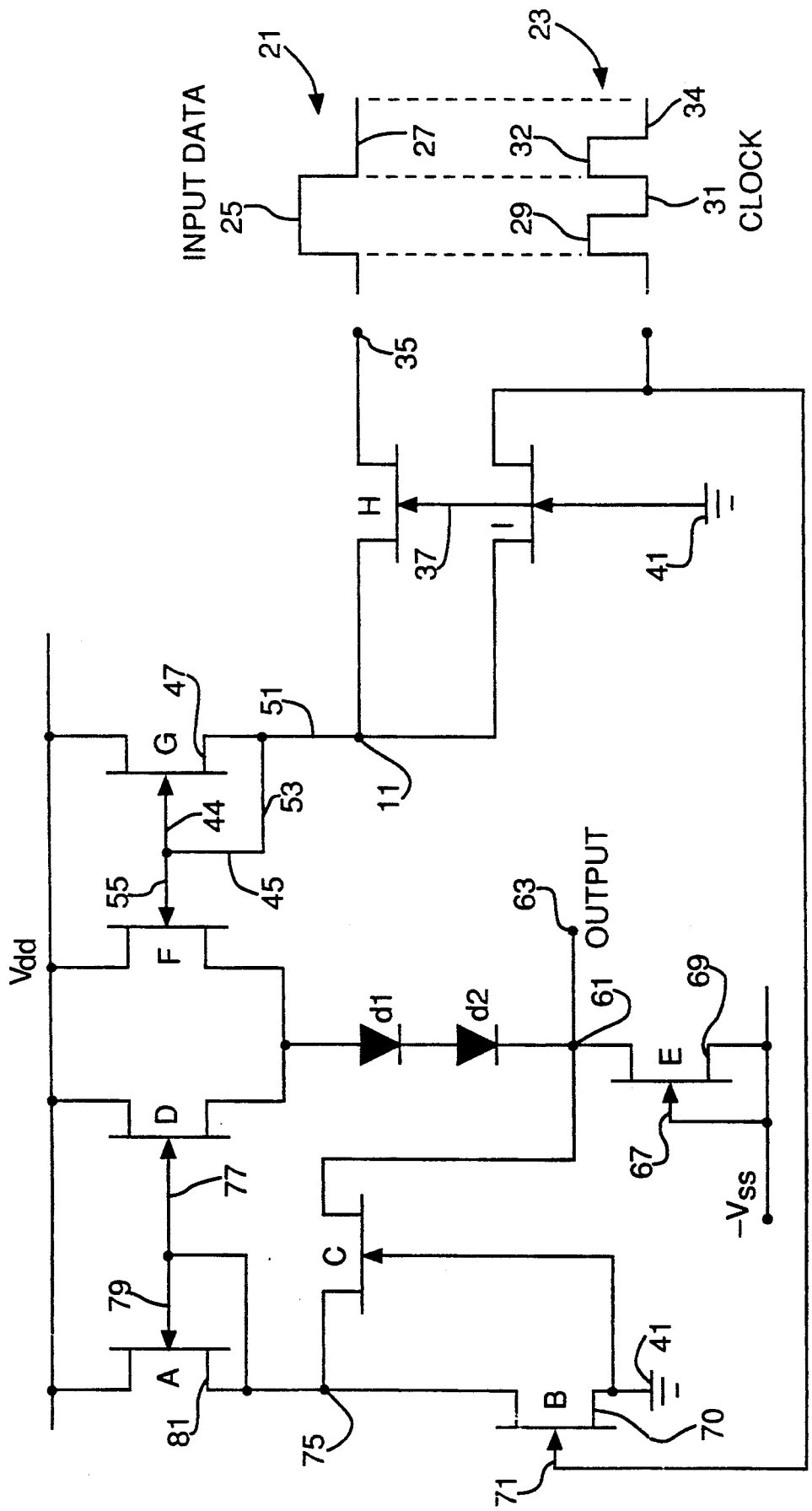
FIG. 1 is a schematic electrical circuit diagram illustrating the improved latch of the present invention.

In general, as illustrated by the embodiment of the invention depicted in the electrical schematic of FIG. 1, the latch circuit of this invention uses positive feedback to maintain latched data when the clock is in the low state. During the high state of the clock, any data appearing at the input is translated to the output in one gate delay.

The latch is non-inverting from input to output. The basic gate used has an inverting and non-inverting input. The width of the inverting and non-inverting input FETs should be equal to the width of the loads so that the switch point of zero volts is invariant with variations in threshold voltage and temperature.

In the circuit, MESFET devices A, B, and C should be equal in size and devices G, H, and I should be equal in size. Device F should be considerably larger than devices A, B, and C. The sizes of diodes d1 and d2 are adjusted to give the optimal level shift in the output. The number of diodes may vary depending on the required level shift in the output.

Power is reduced by roughly a factor of two and frequency of operation increased by a factor of two over conventional designs. In addition, this design eliminates the need for a two-phase clock. The circuit is useful for implementing very high speed shift registers used in communication and error detection circuits.

In order to best described the operation of the circuit, it will be explained for four different conditions: when the data is high and the clock is high, when the data is high and the clock is low, when the data is low and the clock is high, and finally, when the data is low and the clock low. These conditions include all possible operative states of the circuit.

In FIG. 1, the input data is illustrated at 21 and the clock at 23. The input data has a high 25 and a low 27 whereas the clock has a high 29 and a low 31, followed by a high 32 and a low 34. The arrival of a high clock signal simultaneously with a high input data signal causes both input data FET H and clock input FET I to be in the OFF condition. This is so because the input data is applied to data input node 35, but the gate lead 37 for FET H is connected to common ground line 41, and thus, in this gallium arsenide n-channel depletion FET H, the gate is below the source potential and the FET must be OFF. The same holds true of the gallium arsenide n-channel depletion FET I, and it is accordingly OFF at the same time.

The data path node 11 is high because the gallium arsenide n-channel depletion FET G pulls the potential up toward $V_{dd}$ which may be +2.0 or 2.5 volts. FET G is connected in the normally ON condition because its gate 44 is tied over leads 45 and 53 back to its source 47. Thus, this FET could be replaced by a resistor, but it is less expensive in a monolithic circuit to provide a FET rather than a resistor. FET F is also a gallium arsenide n-channel depletion FET and is in the normally ON condition because a high voltage at data node 11 is transferred over leads 51 and 53 to its gate 55.

The input data path for this circuit includes the input data node 35, FET H, and leads 51 and 53. The data output path includes the FET F, diodes d1 and d2, the output node 61, and output lead 63, with the pull-down FET E providing a conduction path to $V_{ss}$ which may be at approximately −2.5 volts. FET E is of the same type as the previously identified FETs and is always ON because its gate 67 is tied to its source 69.

At this point, the high data and high clock have placed a high at data node 61 as the output. In the meantime, the high clock pulse 29 is applied to gate 71 of pull-down FET B. Since its source 70 is tied to the common ground line 41, this FET will be ON. With FET B on, the feedback node 75 is low. This means that feedback path FET D is OFF because its gate 77 is lower than its source even though pull-up FET A is always ON because its gate 79 is tied back to its source 81. Thus, the feedback path may be seen as including FET D to reinforce the potential at output node 61, with FET C being in the return path and pull-down FET A being provided for potential distribution.

Pull-up FET D and pull-up FET F, being connected in parallel, maintain a high at output node 61 if either one is ON, but if both are OFF, then the output node will be at a low.

It may now be seen how the circuit loads the high 25 from data input wave 21 to output data node 61 during the clock high 29. The next cycle, namely with the data high at 25 and the clock low at 31, switches the clock input FET I from OFF to ON without changing the status of the data input FET H. Hence, data node 11 goes low and the output path pull-up FET F is turned OFF. Now, it is necessary to check the feedback path to determine the output potential at data output node 61. The clock low turns pull-down FET B OFF and, consequently, feedback node 75 goes high. This high, effective at the gate 77 of pull-up FET D, turns the feedback path FET D ON which reinforces the high at data output node 61, with the return path being through FET C to ensure positive feedback for reinforcing the data output node during this particular condition of the clock and input data. FET C is connected as a common gate amplifier for ensuring the positive feedback and it, as well as all the other FETs, is a gallium arsenide n-channel depletion FET.

Under the third set of circumstances, the input data is low at 27 and the input clock is high at 32. The low input data applied to input data node 35 causes the source to be lower than the grounded gate and, accordingly, FET H comes ON. However, the opposite condition is true for clock pulse 32 and, accordingly, FET I is OFF. This means that the data node in the data input path, shown at 11, goes low and, accordingly, FET F is OFF. Recall that this is a loading cycle because of the high clock 32. With FET F OFF, a low appears at data output node 61 due to the negative $V_{ss}$ voltage effective through FET E. Also, the feedback path is OFF because pull-up FET B has been turned ON and the feedback node 75 goes low to ensure that FET D is OFF.

Finally, the last set of circumstances is characterized by a low data waveform at 27 and a low clock at 34. The two lows turn ON FETs H and I and maintain the data node 11 low, such that FET F is OFF, which would normally cause a high at output node 61, but the feedback path is now operative to reinforce the low clock, and accordingly, pull-up FET B is OFF, node 75 is high, and feedback FET D is ON, thereby maintaining the low at output node 61 with the return path FET C being ON to complete the positive feedback path.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

We claim:

1. A non-inverting latch circuit responsive to input data and to a clock having high and low levels for translating data from the input to the output in a single logic gate delay comprising:
   a pair of pull-up FETs having their conduction paths connected in parallel;
   an output node in circuit with said FETs for output data;
   a positive feedback path enabled from one of said FETs for reinforcing the data at said output node;
   said one of said FETs enabling the feedback path during said high clock levels;
   the other of said FETs applying data to said node during said low clock levels;
   data input FET means for enabling and disabling said other FET in accordance with the input data; and
   clock input FET means for enabling and disabling said one FET in accordance with said clock levels.

2. The latch circuit of claim 1, wherein:
   said clock input FET means comprises a pull-down FET in the opposite state of conduction or non-conduction from that of said one FET.

3. The latch circuit of claim 2, wherein:
   said clock input FET means also comprises a FET receiving input from said clock; and
   said receiving FET has an output junction in common with the output of said data input FET means, whereby said output junction is a data node.

4. The latch circuit of claim 3, further comprising:
   a first line to which a positive source of potential is attached;
   a second line to which a negative source of potential is attached;
   a common ground line;
   a first resistor means connected between the first line and said data node; and
   a connection from the data node to said other FET for supplying potential thereto in accordance with said input data.

5. The latch circuit of claim 4, wherein:
   a second resistor means is connected between said first line and a feedback node;
   said pull-down FET is connected between the ground line and said feedback node; and
   said one FET is connected to said feedback node.

6. The latch circuit of claim 5, further comprising:
   a third resistor means connected between the second line and the output node; and
   voltage dropping means connected between said one FET, said other FET, and said output node to set a voltage output level.

7. The latch circuit of claim 6, further comprising:
   a common gate amplifier FET connected between said feedback node and said output node.

8. The latch circuit of claim 7, wherein:
   said data input means comprises a common gate amplifier FET connected to an input data node and to said data node; and
   said receiving FET for the clock input comprises a common gate amplifier FET connected between a clock input node and said data node.

9. The latch circuit of claim 8, wherein:
   all three common gate amplifier FETs have their gates connected to the ground line.

10. The latch circuit of claim 9, wherein:
    the second resistor means comprises a FET with its gate connected to its source;
    the second resistor means FET, the pull-down FET and the common gate amplifier FET connected to the feedback node are all substantially the same size;
    the first resistor means is a FET having its gate connected to its source; and
    the data input FET, the clock input receiving FET, and the first resistor FET are all substantially the same size.

11. The latch circuit of claim 10, wherein:
    all FETs comprise depletion MESFETs.

12. The latch circuit of claim 11, wherein:
    said other FET is substantially larger than said pull-down FET.

13. A high speed MESFET gallium arsenide depletion mode logic latch circuit which receives high and low data signals and clock levels, stores the data on high clock levels, and maintains the stored data during the low clock levels, comprising:
    a first line to which a positive source of potential is attached;
    a second line to which a negative source of potential is attached;
    a common ground line;
    a data input node;
    a data input path connected between the first line and the input node, said path comprising a data node;
    pull-up means connected between the first line and the data node;
    common gate means connected between the data node and the input node;
    an output path connected between the first line and the second line including an output node therebetween;

an output path pull-up FET and voltage dropping means connected in series between the first line and the output node with the voltage dropping means being connected directly to the output node;

pull-down means connected between the second line and the output node;

a feedback path circuit at least partly connected between the ground line and said first line and including a feedback node;

a feedback pull-up means connected between the first line and the feedback node and a feedback pull-down FET connected between the feedback node and ground;

a feedback pull-up FET connected between the first line and said voltage dropping means of the output path and having an enabling connection from the feedback node whereby on a low clock level, when the feedback pull-down FET is not enabled, the feedback pull-up FET is enabled to reinforce the output node data level; and clock common gate input means receiving the clock input to deliver control signals to the feedback pull-down FET.

14. The latch of claim 13, wherein:

the feedback pull-up means further comprises a FET;

the first mentioned pull-up means of the data input path further comprises a FET;

the data input common gate means further comprises a FET;

the clock common gate input means further comprises a FET, said first mentioned pull-up means FET, said data input common gate means FET, and said and said clock common gate input means FETs having substantially the same size;

the output path pull-up FET further comprises a FET having a substantially greater size than the feedback pull-down FET; and further comprising:

a feedback path common gate FET connected between the feedback node and the output node, said feedback path common gate FET, said feedback pull-up means FET, and said feedback pull-down FET having substantially the same size.

\* \* \* \* \*